(12) United States Patent
Lee

(10) Patent No.: US 6,838,339 B2
(45) Date of Patent: Jan. 4, 2005

(54) AREA-EFFICIENT STACK CAPACITOR

(75) Inventor: Heon Lee, Kyungbuk (KR)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/456,648

(22) Filed: Jun. 5, 2003

(65) Prior Publication Data

US 2004/0248365 A1 Dec. 9, 2004

(51) Int. Cl.[7] .................. H01L 21/8242; H01L 21/20
(52) U.S. Cl. .................. 438/253; 438/255; 438/398
(58) Field of Search .................. 438/238, 239, 438/244, 253, 255, 396, 397, 398, 686; 257/309

(56) References Cited

U.S. PATENT DOCUMENTS

| | | | |
|---|---|---|---|
| 5,766,995 A * | 6/1998 | Wu .................. | 438/255 |
| 5,877,052 A * | 3/1999 | Lin et al. .................. | 438/238 |
| 5,990,559 A * | 11/1999 | Marsh .................. | 257/768 |
| 6,143,617 A * | 11/2000 | Shue et al. .................. | 438/396 |
| 6,281,543 B1 * | 8/2001 | Al-Shareef et al. .......... | 257/309 |
| 6,339,007 B1 | 1/2002 | Wang et al. .................. | 438/393 |
| 6,339,241 B1 | 1/2002 | Mandelman et al. ........ | 257/301 |
| 6,700,148 B2 * | 3/2004 | Kim .................. | 257/296 |
| 6,730,563 B2 * | 5/2004 | Matsumura .................. | 438/255 |
| 6,730,956 B2 * | 5/2004 | Bae et al. .................. | 257/306 |
| 6,753,618 B2 * | 6/2004 | Basceri et al. .................. | 257/296 |
| 2003/0062558 A1 * | 4/2003 | Yang et al. .................. | 257/296 |
| 2004/0009646 A1 * | 1/2004 | Lin et al. .................. | 438/381 |

* cited by examiner

Primary Examiner—T. N. Quach
(74) Attorney, Agent, or Firm—Slater & Matsil, L.L.P.

(57) ABSTRACT

An area-efficient stack capacitor for use in an integrated circuit comprises, in one embodiment, a layer of elemental platinum (Pt) as a bottom electrode, a layer of hemispherical grained poly Si on top of the Pt bottom electrode, a second layer of Pt deposited over the layer of hemispherical grained poly Si, a layer of dielectric deposited over the second layer of Pt, and a third layer of Pt deposited over the dielectric layer, where the third layer of Pt acts as upper electrode.

14 Claims, 6 Drawing Sheets

AREA-EFFICIENT STACK CAPACITOR

FIELD OF THE INVENTION

The present invention relates generally to capacitors and, in particular, to area efficient stack capacitors.

BACKGROUND

Capacitors are widely used in integrated circuits (ICs) such as dynamic random access memory (DRAM) devices. Over the years, the density of DRAMs on IC circuits has increased many times over, yet demand for even greater density continues. As DRAM devices become increasingly integrated, there is a need for creating capacitors that occupy less area than have previous capacitors and, ultimately, that occupy minimal IC area, subject to various constraints. Chief among these constraints is the need to preserve the capacitance of the devices even as their area is reduced. ICs are predominantly planar and, in discussing area optimization of a capacitor, it is the plane of the IC and, the reduction of area in that plane, that is of primary concern.

Each DRAM cell includes a single transistor and a capacitor. The capacitor can occupy only a fraction of the DRAM cell area because each capacitor in the DRAM cell must be isolated from adjacent capacitors in an array.

Creating higher capacitances in each DRAM cell is beneficial to maintaining the DRAM's characteristics. Several ways exist in which to increase the DRAM's capacitance. The DRAM's dielectric layer could be made from higher dielectric constant materials, a thinner dielectric layer could be used, or the DRAM could have a larger dielectric layer. However, creating a capacitor structure having the largest possible surface area is the best way to increase the DRAM's capacitance.

Achieving optimal capacitor area is complicated by a number of design challenges. For example, commonly used dielectrics may suffer from limitations as to their required thickness. In recent years, development efforts have focused on creating high-permittivity materials for a DRAM capacitor. Current DRAMs contain capacitors using a thin dielectric sandwiched between two electrodes made of doped crystalline or polycrystalline silicon. Various materials have been tested for their suitability as dielectrics, one of them being the thin-film barium strontium titanate (BSTO). Other possible dielectrics include STO and SBT. Even if these materials prove feasible and practicable, the reduction in size resulting from such material improvements would not necessarily address the entirety of the demand for even further reduced capacitor area.

Without somehow reducing the capacitors' area, however DRAMs cannot continue to be reduced in size relative to the plane of the IC. An unmet need therefore exists for an area-efficient capacitor that occupies minimal IC area, while maintaining its capacitance.

SUMMARY OF THE INVENTION

The present invention is directed to an area-efficient stack capacitor capable of addressing at least some of this unmet need. The present invention is also directed to a method for making the area-efficient stack capacitor. An embodiment of the invention involves formation of a spacer of elemental platinum (Pt), oxide hard mask removal, and hemispherical grained poly Si processes. These techniques are applied to produce a freestanding, hollow-cylindrically shaped Pt electrode having an embossed surface, which may be used as a bottom electrode of a capacitor. As a result, both sides of the double hollow cylinder shaped bottom electrode are available for use as an active charge storage area and one of the sides has an embossed surface for obtaining a higher surface area which increases a DRAM's capacitance.

In one aspect of an embodiment of the present invention, a method is provided for fabricating a capacitor in an integrated circuit in which a layer of Pt is deposited over a cell and a layer of oxide is deposited over the Pt layer. Both the Pt and oxide layers are then etched. A layer of amorphous silicon (a-Si) is deposited over the etched Pt and oxide layers. A second layer of Pt, which will form a spacer, is then deposited over the a-Si layer. The second Pt layer is then etched and the oxide is removed, leaving a freestanding, double hollow cylinder-shaped bottom electrode having an embossed surface. Finally, a layer of dielectric is deposited and a third layer of Pt is deposited over the dielectric.

DETAILED DESCRIPTION

Figure 1B:
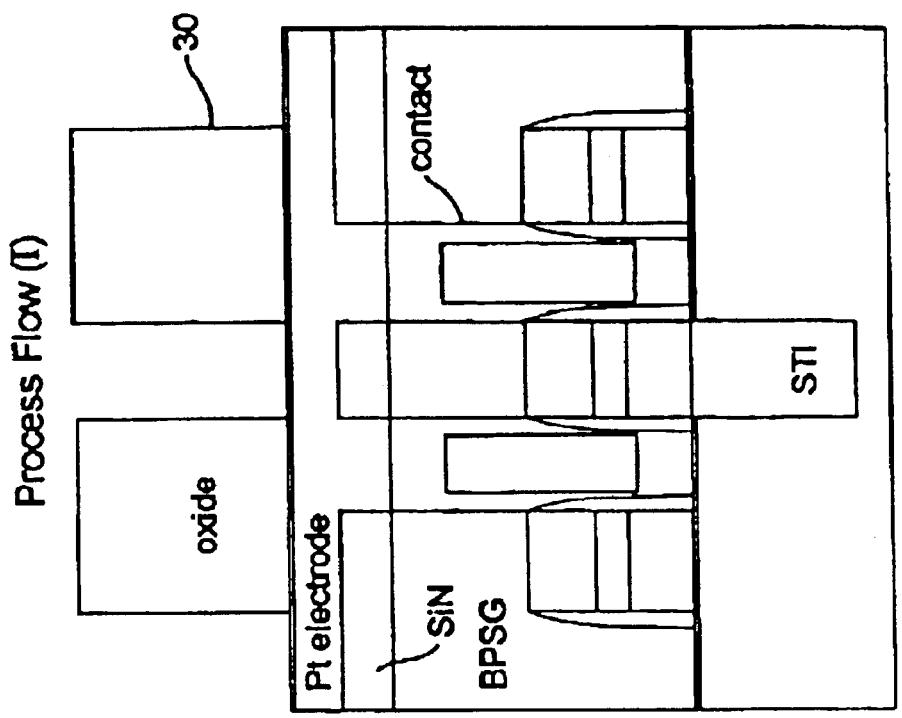
FIG. 1B is a diagram showing the intermediate structure of FIG. 1A, having been etched to form a further intermediate structure, in an embodiment of the present invention.
Figure 1A:
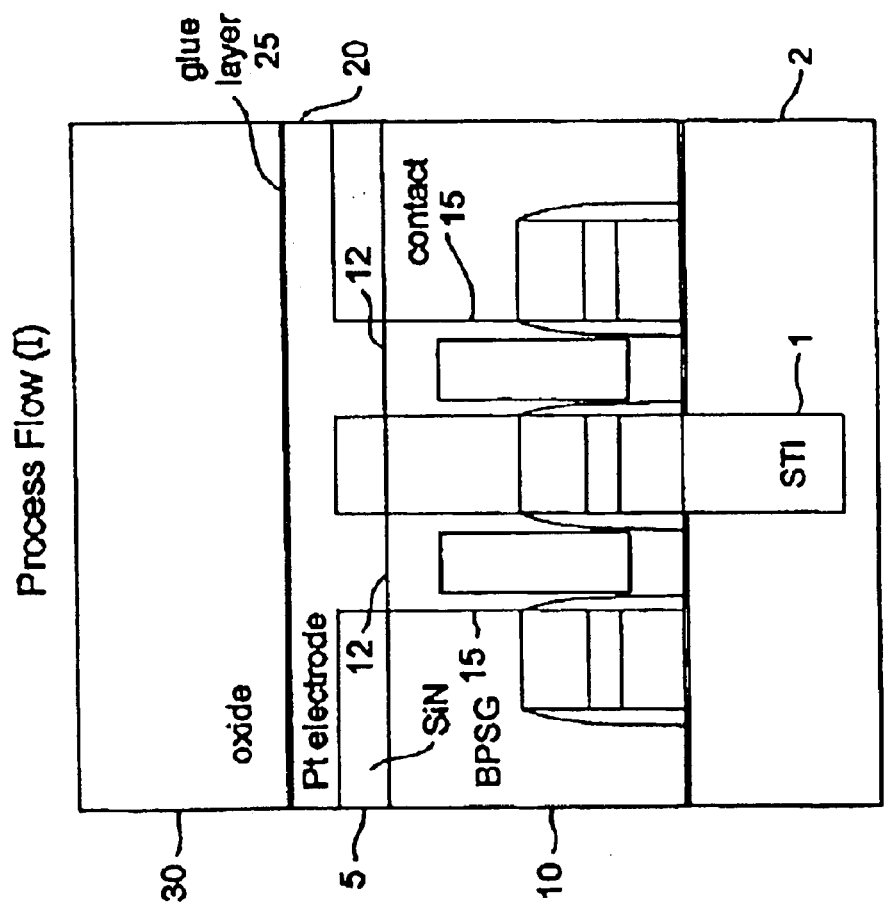
FIG. 1A is a diagram showing Pt, glue, and oxide layers deposited on a cell in an array to form an intermediate structure formed in an embodiment of the present invention.

FIG. 1A shows a first step, in an embodiment of a method, and an intermediate IC structure, according to the present invention. This and the subsequently related steps describe one embodiment for achieving the area-efficient stack capacitor of the present invention. In FIG. 1A, a shallow trench isolation 1 is implanted into a substrate 2. A layer 10 of boro-phospho-silicate glass ("BSPG") is formed over substrate 2, and an insulating material 5 such as SiN is formed over layer 10. Photolithographic techniques, such as are known in the art, are used to selectively etch through layers 5 and 10 and form contact holes 12. A conductive material, such as doped polycrystalline silicon, W, or metallic W, is deposited into the contact holes and forms contact plugs 15. After the contact plugs are in place, a highly conductive layer 20, preferably platinum (Pt), is deposited on top of the structure. Ruthenium (Ru), Iridium (Ir) and their oxides can be used as alternative materials for an electrode instead of Pt. Ru and Ir are adequate substitutes for Pt because both Ru and Ir are conducting materials and resistant to oxidation. Furthermore, the oxides of both Ru and Ir are conductive. Glue layer 25, which can be made from TiN, TiAlN or TaN, is deposited on top of Pt layer 20. TiN, TiAlN, and TaN all enhance adhesion between Pt and oxide layers, conduct electricity well, and are easily removable by wet etch processes. Oxide layer 30 is then deposited over layer 25. Layer 30 is a removable hard mask that can be etched.

FIG. 1B is a diagram showing the intermediate structure of FIG. 1A etched. In FIG. 1B, oxide layer 30 is etched, typically with reactive ion etching, leaving an oxide mask open. Anything under the oxide mask will not be etched during the etching process.

Figures 2A, 2B:
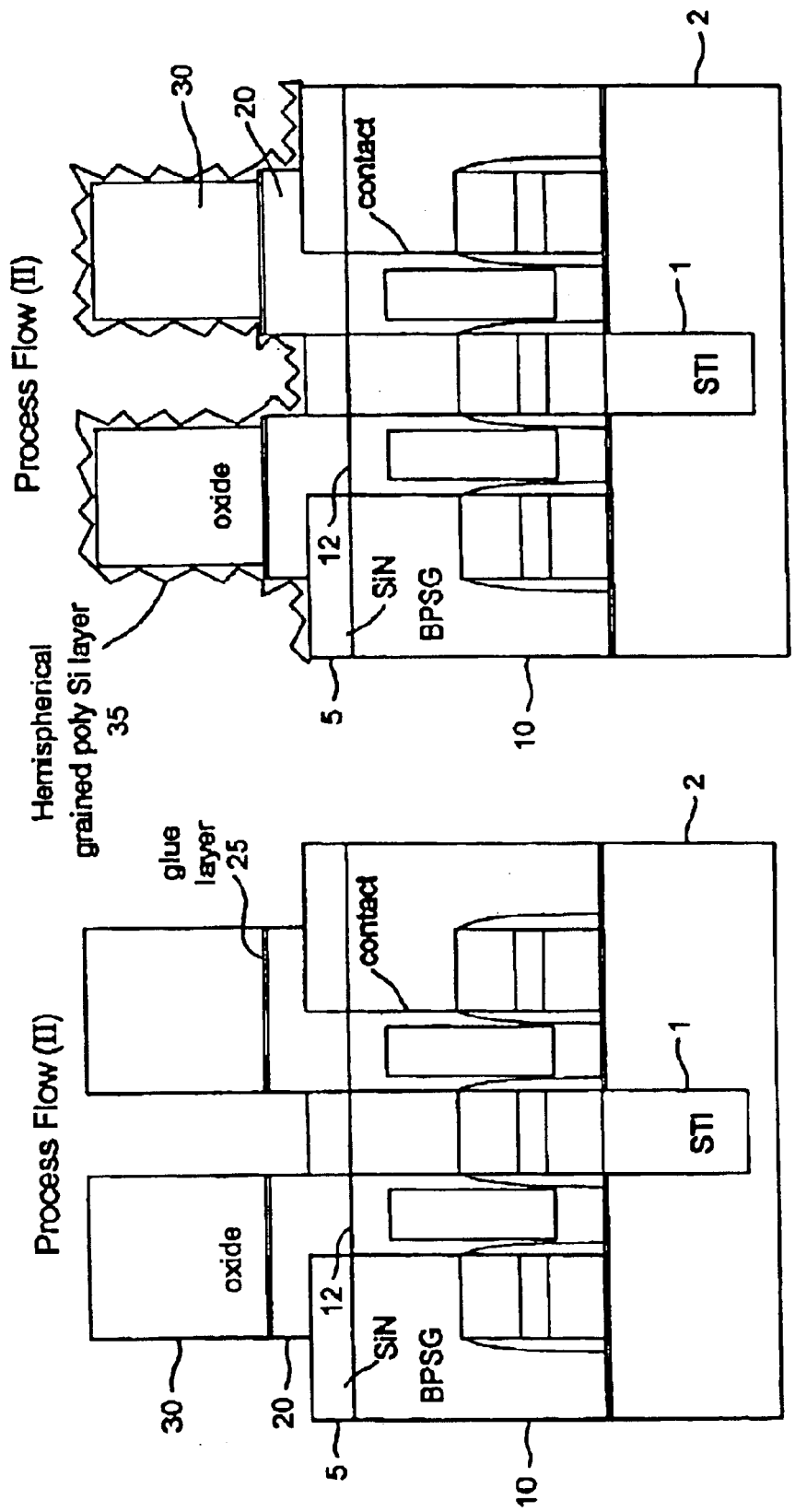
FIG. 2A is a diagram showing the intermediate structure of FIG. 1B, having been further etched, to produce another intermediate structure, in an embodiment of the present invention.
FIG. 2B is a diagram showing a-Si deposited over the intermediate structure of FIG. 2A, and a further intermediate structure, in an embodiment of the present invention.

In FIG. 2A, Pt layer 20 is etched. Nevertheless, the etching process does not reach the portion of Pt layer located underneath the oxide mask. Therefore, after the etch, a layer of Pt remains under the oxide mask. This remaining Pt is used as a bottom electrode.

As shown in FIG. 2B, a texturing layer 35, preferably of a-Si, is deposited over the intermediate structure of FIG. 2A. The texturing layer 35 has a surface that is embossed, textured, roughened or an otherwise non-smooth, surface having protruding features. In the illustrated embodiment, hemispherical grained poly Si ("a-Si") layer 35 is deposited over the structure illustrated in FIG. 2A that will eventually impart surface features to an electrode of the capacitor as described below.

Figures 3A, 3B:
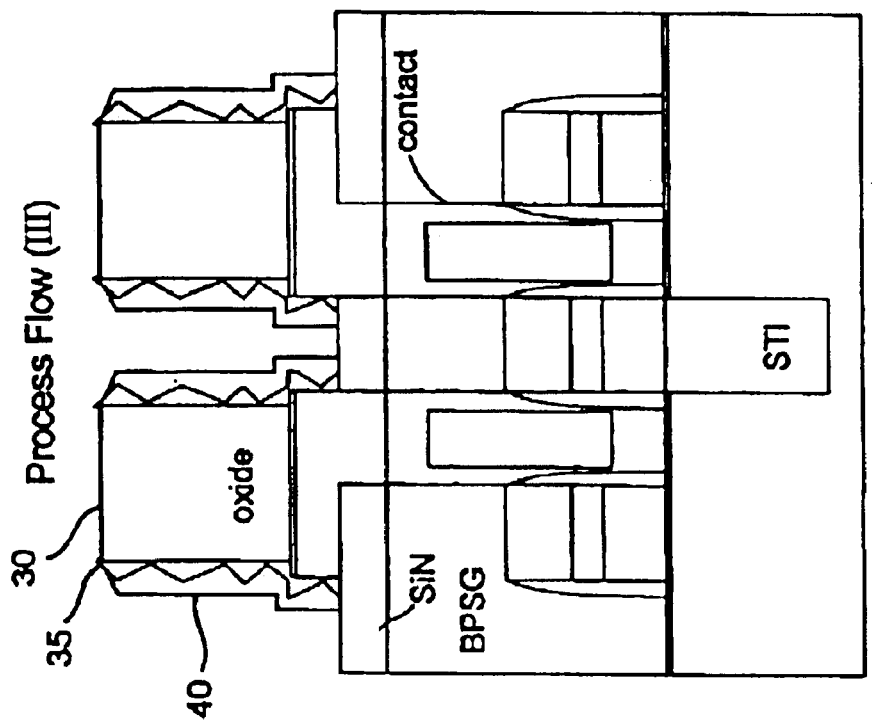
FIG. 3A is a diagram showing a Pt layer deposited over the intermediate structure of FIG. 2B, and a further intermediate structure, in an embodiment of the present invention.
FIG. 3B is a diagram showing the intermediate structure of FIG. 3A having been etched, and a further intermediate structure, in an embodiment of the present invention.

In FIG. 3A, a spacer layer 40, preferably Pt, is deposited over the embodiment illustrated in FIG. 2B. Pt layer 40 forms a spacer layer for fabricating a hollow cylindrical shape.

FIG. 3B is a diagram showing the intermediate structure of FIG. 3A having been etched. In FIG. 3B, Pt layer 40 is anisotropically (directionally) etched to form the hollow cylindrical shape.

Figure 4A:
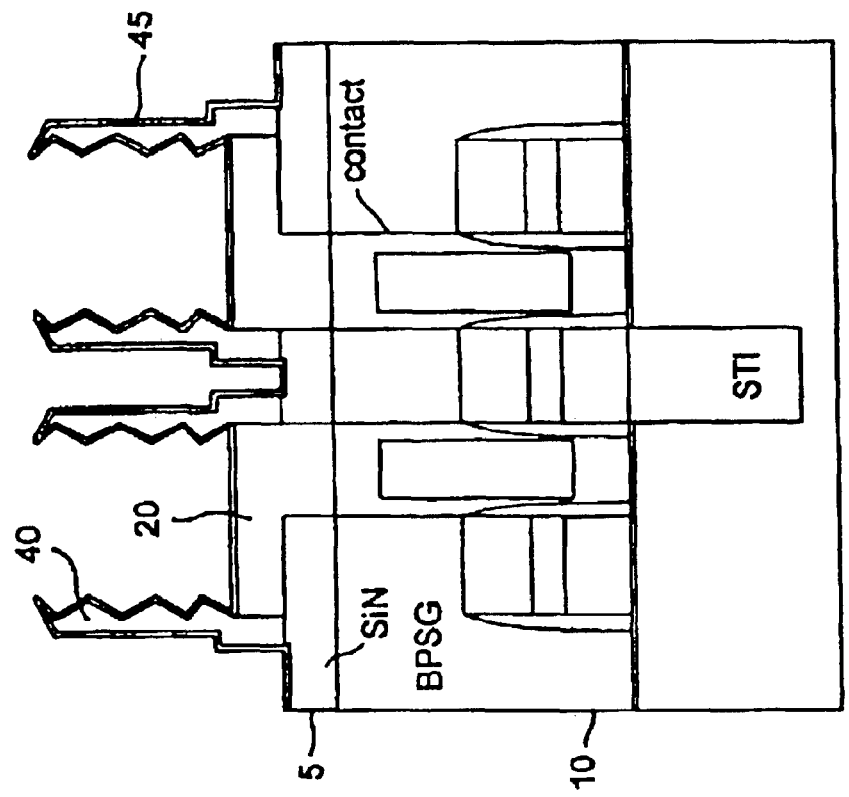
FIG. 4A is a diagram showing oxide and a-Si layers removed from the intermediate structure of FIG. 3B to form another intermediate structure in an embodiment of the present invention.

FIG. 4A shows oxide and a-Si layers removed from the intermediate structure of FIG. 3B. The oxide mask 30 remaining in the intermediate structure of FIG. 3B is removed. A wet etch is applied, removing the a-Si 35 layer. With the oxide mask 30 and a-Si 35 layers removed, a freestanding double hollow cylinder-shaped bottom electrodes are formed. This hollow cylinder-shaped electrode serves the function of creating a capacitor having large surface area over a small area of an IC.

Figure 4B:
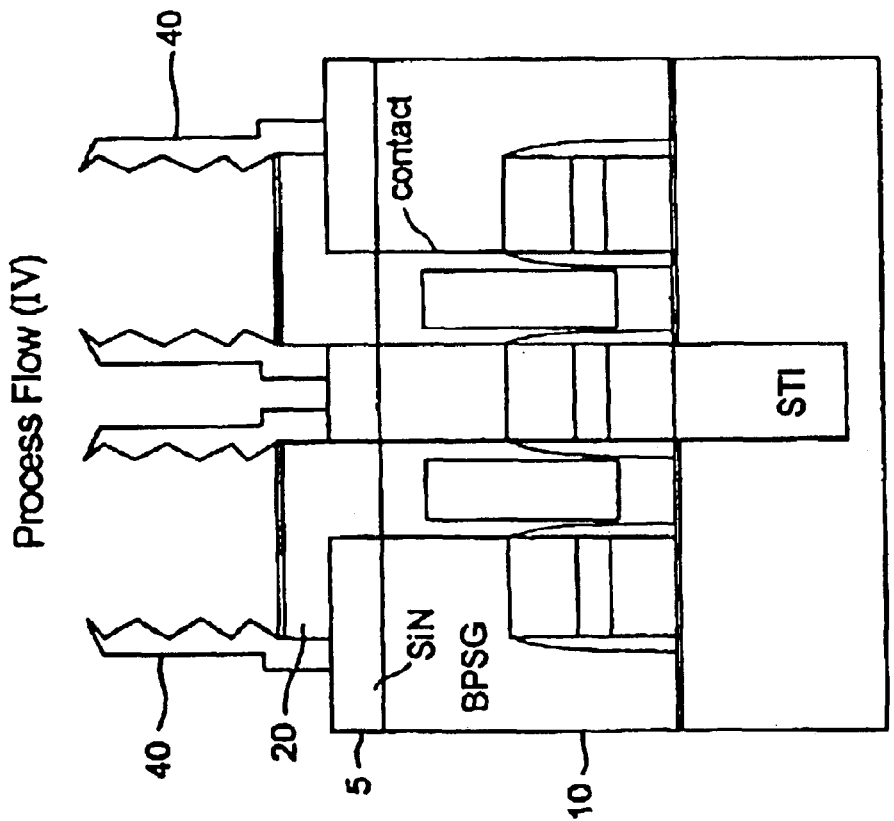
FIG. 4B is a diagram showing a capacitor dielectric film deposited over the intermediate structure of FIG. 4A to yield yet another intermediate structure in an embodiment of the present invention.

FIG. 4B shows a capacitor dielectric film deposited over the intermediate structure of FIG. 4A. Dielectric film 45 may contain a high dielectric constant material such as BSTO, STO, or SBT. These dielectric films help the capacitor retain greater amounts of charge for longer periods of time.

Figure 5:
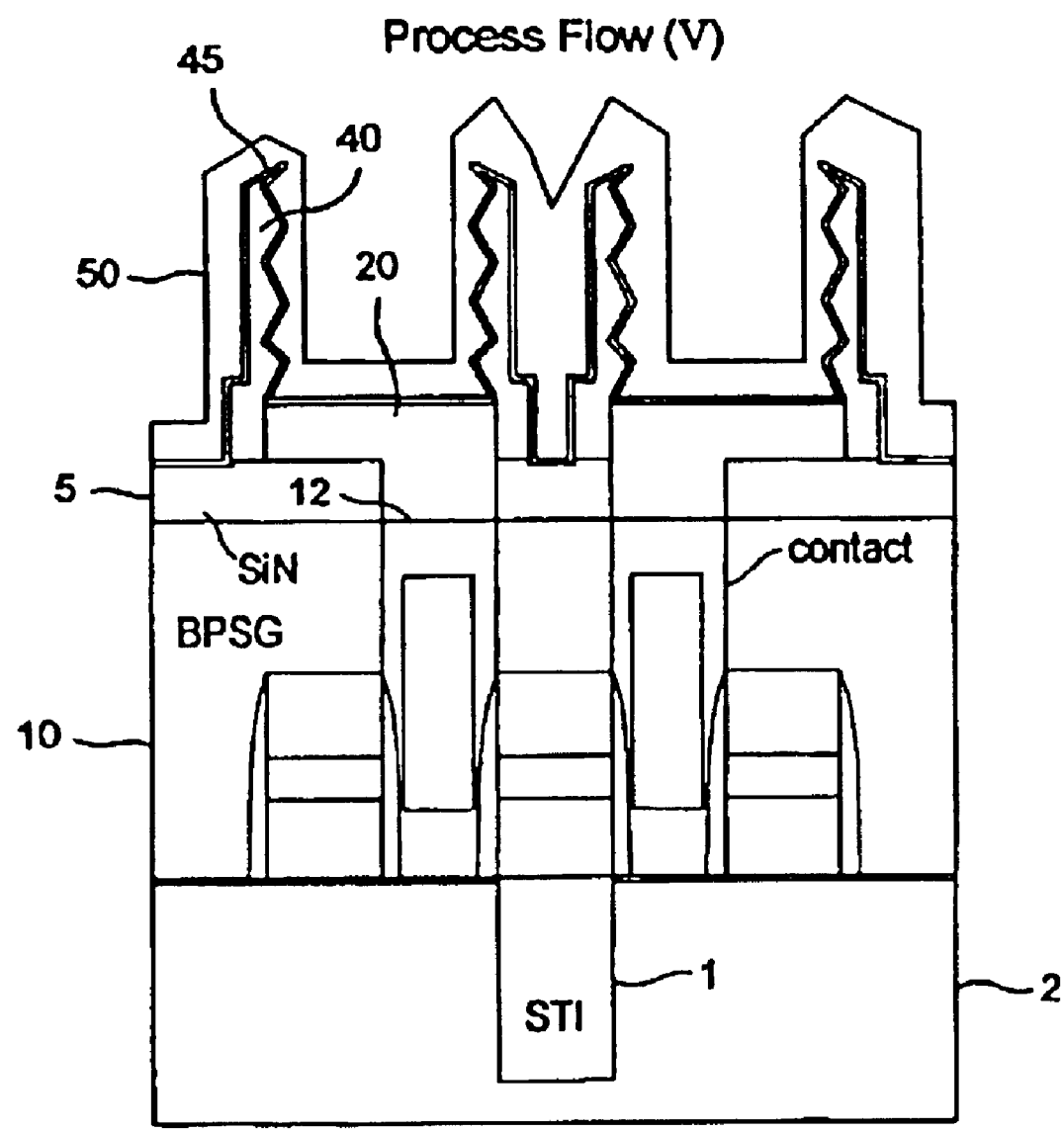
FIG. 5 is a diagram showing a Pt layer deposited over the intermediate structure of FIG. 4B to produce a capacitor in an embodiment of the present invention.

FIG. 5 is a diagram showing a conducting layer deposited over the intermediate structure of FIG. 4B. In FIG. 5, conducting layer 50, preferably Pt, is deposited on top of the intermediate structure in FIG. 4B and used as an upper electrode. As stated earlier, Ru, Ir and their oxides can be substituted for Pt. Thus, we are left with a capacitor having a dielectric layer located between upper and lower electrodes. Regarding the upper electrodes, they have surface features that maximize their area without an increase in the size of the capacitor. Increasing the surface area also increases the amount of charge storable on the capacitor. This device works exactly like a normal DRAM and has the added functionality of having a complex shaped capacitor which increases the DRAM's capacitance.

Figure 6:
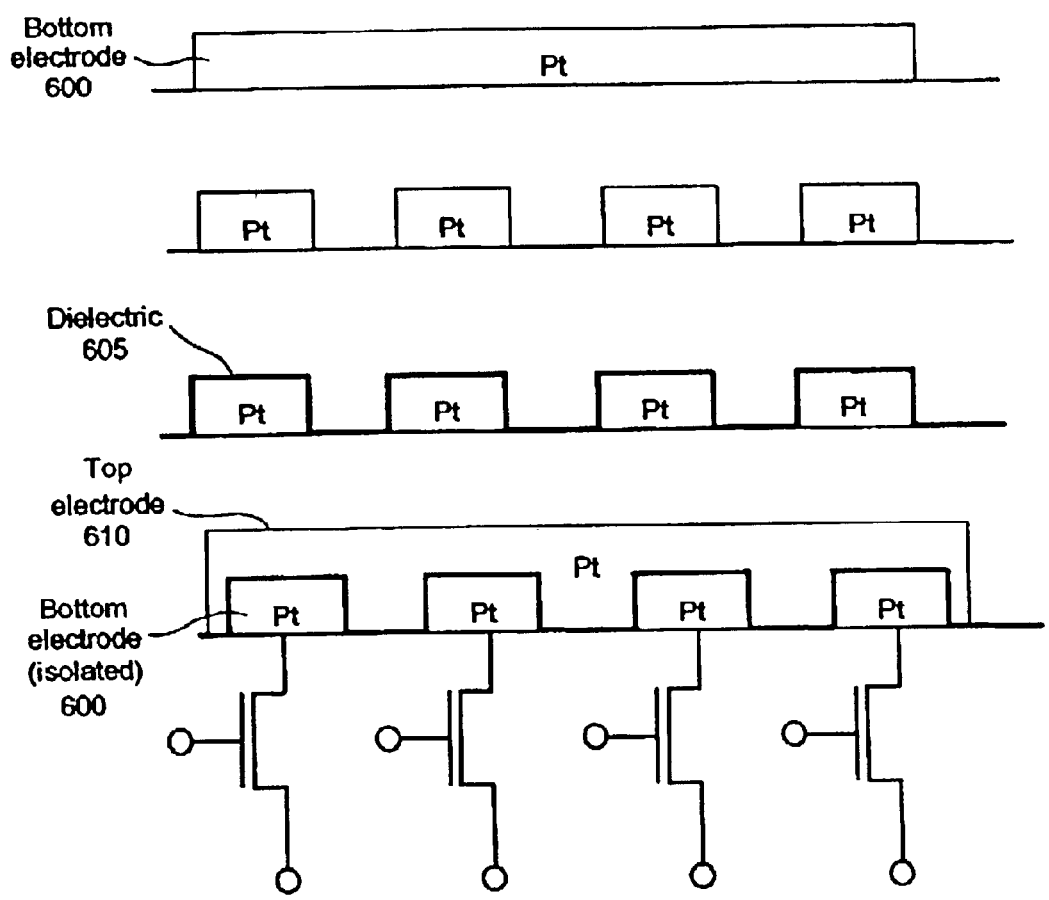
FIG. 6 is a diagram showing a progression of Pt layers being deposited over each other to form an embodiment of the present invention.

FIG. 6 shows on a macro-level how the Pt layers are deposited over each other. A bottom electrode layer of Pt 600 is etched. Subsequently, a layer of dielectric 605 is deposited over the bottom electrode 600. Finally, a top electrode layer of Pt 610 is deposited over the dielectric layer 605.

While the invention has been particularly shown and described with reference to particular embodiments, those skilled in the art will understand that various changes in form and details may be made without departing form the spirit and scope of the invention as set forth in the appended claims. For example, steps associated with the methods according to the present invention are not necessarily limited to the order in which they are shown or described.

What is claimed is:

1. A method of forming a capacitor for use with an integrated circuit comprising the steps of:

providing a substrate having an electrical contact area and covered by an insulating layer having a top surface, said insulating layer defining a via extending from said top surface to said electrical contact area;

forming a patterned hard mark structure over said insulating layer;

depositing a layer of a-Si (amorphous silicon) over said patterned hard mask structure and said insulating layer, said layer of a-Si having an exposed textured surface;

forming a layer of conductive material over said layer of a-Si to form a bottom plate, said bottom plate in electrical contact with said electrical contact area of said substrate and having an inside surface that conforms to said textured surface of said a-Si layer;

removing said patterned hard mask and said layer of a-Si to form a free standing bottom electrode;

depositing a layer of dielectric material over said free standing bottom electrode; and depositing a conductive capacitor plate layer over said layer of dielectric material.

2. The method according to claim 1, wherein the bottom plate comprises at least one selected from the group consisting of platinum, ruthenium, and iridium.

3. The method according to claim 1, wherein the capacitor plate layer comprises at least one selected from the group consisting of platinum, ruthenium, and iridium.

4. The method according to claim 1, wherein the dielectric comprises at least one material selected from the pup consisting of BSTO, STO, SBT, and combination thereof.

5. The method of claim 1 wherein said step of providing a substrate comprises providing a substrate having at least two electrical contact areas and wherein said conductive bottom plate formed of conductive material is in contact with said at least two electrical contact areas and further comprising etching said bottom plate to separate said bottom plate and electrically isolate said at least two contact areas.

6. The method of claim 5 further comprising depositing a first layer of conductive material in contact with said at least two electrical contact areas on said substrate prior to said step of forming said patterned hard mask.

7. The method of claim 6, wherein the first layer of conductive material comprises at leas one material selected from the group consisting of platinum, ruthenium, and iridium.

8. The method of claim 6 and further comprising etching said first layer of conductive material to separate said first layer of conductive material and electrically isolate said at least two contact areas.

9. The method of claim 1 further comprising depositing a first layer of conductive material in contact with said electrical contact area on said substrate prior to said step of forming said patterned hard mask.

10. The method according to claim 9, wherein the first layer of conducive material comprises at least one material selected from the group consisting of platinum, ruthenium, and iridium.

11. The method of claim 1 wherein said insulating layer comprises a layer of BSPG (boro-phospho-silicate glass) and a layer of SiN (silicon nitride).

12. A method for forming a capacitor for use with an IC comprising the steps of:

providing an IC substrate having at least two electrical contact areas, said substrate covered by an insulating layer having a top surface, said insulating layer defining at least two vias extending from said top surface to said at least two electrical contact areas filled with a conductive material to form a conductive plugs;

depositing a first layer of conductive material in contact with said at least two electrical conductive plugs;

forming a patterned hard mask structure over said first layer of conductive material;

etching said first layer of conductive material to separate said first layer and electrically isolate said at least two contact areas;

depositing a layer of a-Si (amorphous silicon) over said patterned hard mask and said insulating layer, said layer of a-Si having an exposed textured surface;

depositing a bottom plate of conductive material over said layer of a-Si in electrical contact with said first layer of conductive material and having an inside surface in contact with and conforming to said exposed textured surface of said a-Si layer, etching said bottom plate to separate said bottom plate so as to electrically isolate said at least two electrical contact areas;

removing said patterned hard mask and said layer of a-Si to form a free standing bottom plate;

depositing a layer as dielectric material over said free standing bottom plate; and depositing a top capacitor electrode.

13. The method of claim 12 wherein at least one of said first layer of conductive material, said bottom plate of conductive material and said top capacitor electrode are made from a material selected from the group consisting of platinum, ruthenium, and iridium.

14. The method of claim 12 wherein said dielectric comprises at least one material selected from the group consisting of BSTO, STO, SBT and combinations thereof.

* * * * *

UNITED STATES PATENT AND TRADEMARK OFFICE
CERTIFICATE OF CORRECTION

PATENT NO. : 6,838,339 B2
DATED : January 4, 2005
INVENTOR(S) : Lee

It is certified that error appears in the above-identified patent and that said Letters Patent is hereby corrected as shown below:

Column 4,
Line 28, delete "mark" and insert -- mask --.
Line 51, delete "pup" and insert -- group --.
Line 65, delete "leas" and insert -- least --.

Signed and Sealed this

Tenth Day of May, 2005

JON W. DUDAS
*Director of the United States Patent and Trademark Office*